United States Patent [19]
Naruke et al.

[11] Patent Number: 5,751,636
[45] Date of Patent: May 12, 1998

[54] SEMICONDUCTOR MEMORY DEVICE HAVING DATA ERASING MECHANISM

[75] Inventors: Kiyomi Naruke; Tomoko Suzuki; Seiji Yamada, all of Tokyo; Etsushi Obi, Yokohama; Masamitsu Oshikiri, Sagamihara, all of Japan

[73] Assignee: Kabushiki Kaisha Toshiba, Kawasaki, Japan

[21] Appl. No.: 785,397

[22] Filed: Jan. 21, 1997

Related U.S. Application Data

[63] Continuation of Ser. No. 440,253, May 12, 1995, Pat. No. 5,623,445, which is a continuation of Ser. No. 903,949, Jun. 26, 1992, Pat. No. 5,452,248.

[30] Foreign Application Priority Data

Jun. 27, 1991 [JP] Japan .................................. 3-157063

[51] Int. Cl.$^6$ .................................................. G11C 7/00
[52] U.S. Cl. ........................... 365/189.29; 365/189.24; 365/189.28
[58] Field of Search .................. 365/218, 185.29, 365/185.28, 185.3, 185.24

[56] References Cited

U.S. PATENT DOCUMENTS

| | | | |
|---|---|---|---|
| 4,173,791 | 11/1979 | Bell | 365/185 |
| 4,503,519 | 3/1985 | Arakawa | 365/185 |
| 4,742,491 | 5/1988 | Liang et al. | 365/185 |
| 4,884,239 | 11/1989 | Ono et al. | 365/218 |
| 5,272,669 | 12/1993 | Samachisa et al. | 365/218 |
| 5,280,446 | 1/1994 | Ma et al. | 365/185.39 |
| 5,289,401 | 2/1994 | Shima et al. | 365/185.24 |
| 5,379,256 | 1/1995 | Tanaka et al. | 365/185.24 |

FOREIGN PATENT DOCUMENTS

| | | |
|---|---|---|
| 0 252 027 | 1/1988 | European Pat. Off. . |
| 0 301 521 | 2/1989 | European Pat. Off. . |
| 0 369 676 | 5/1990 | European Pat. Off. . |
| 5-571 072 | 5/1980 | Japan . |
| 3-230 566 | 10/1991 | Japan . |

OTHER PUBLICATIONS

E. Takeda et al., "Device Performance Degradation Due to Hot–Carrier Injection at Energies Below the Si–SiO$_2$ Energy Barrier", 1983 International Electron Devices Meeting, Article No. 15.5, pp. 396–399, Dec. 1983.

S. Yamada et al., "A Self–Convergence Erasing Scheme for a Simple Stacked Gate Flash EEPROM", 1991 International Electron Devices Meeting, Article No. 11.4, pp. 307–310, Dec. 1991.

K. Naruke et al., "Restraint of Variation in Threshold Voltage to 1/3, Prevention of Excessive Erasion is Flash Type EEPROM", Nikkei Microdevices, pp. 85–91, Feb. 1992.

Primary Examiner—Vu A. Le
Attorney, Agent, or Firm—Banner & Witcoff, Ltd.

[57] ABSTRACT

In this invention, charges are extracted from the charge storage portion by means of F-N tunnel current, and then avalanche hot carriers are injected into the storage portion.

7 Claims, 15 Drawing Sheets

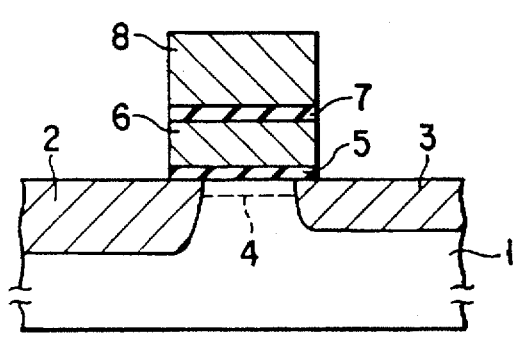
F I G. 1

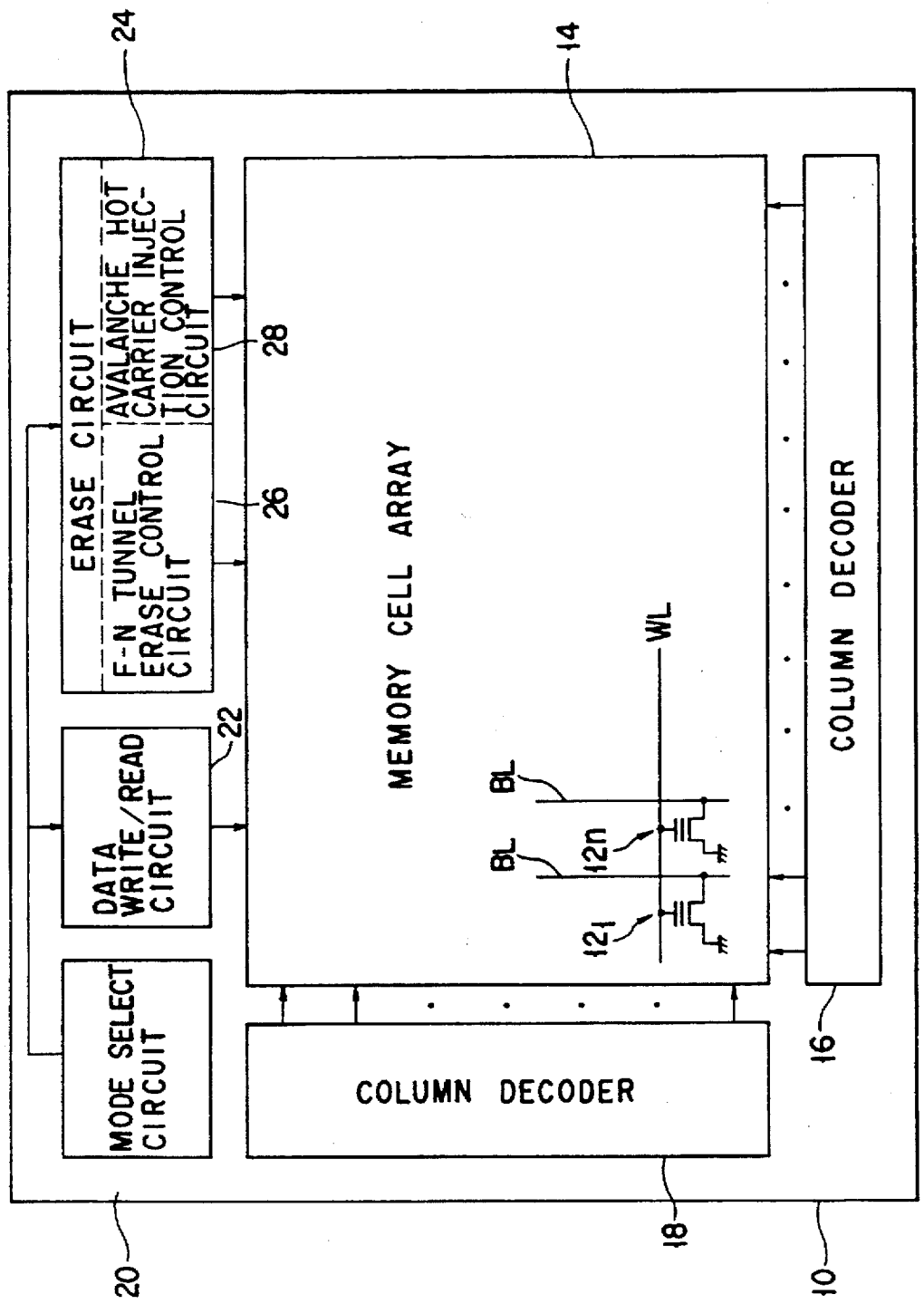
F I G. 4

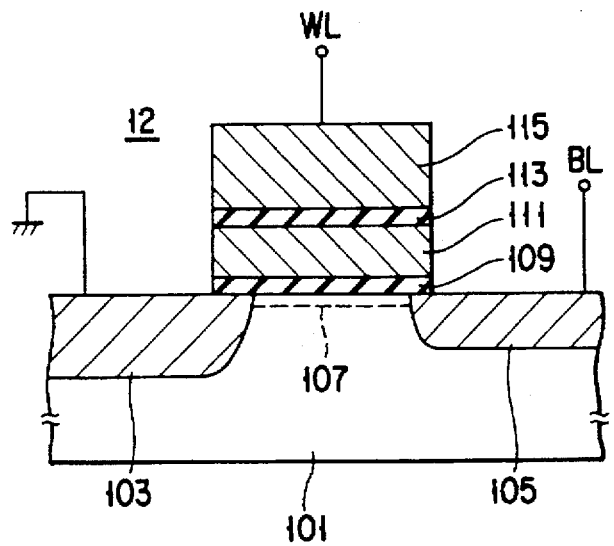
F I G. 5
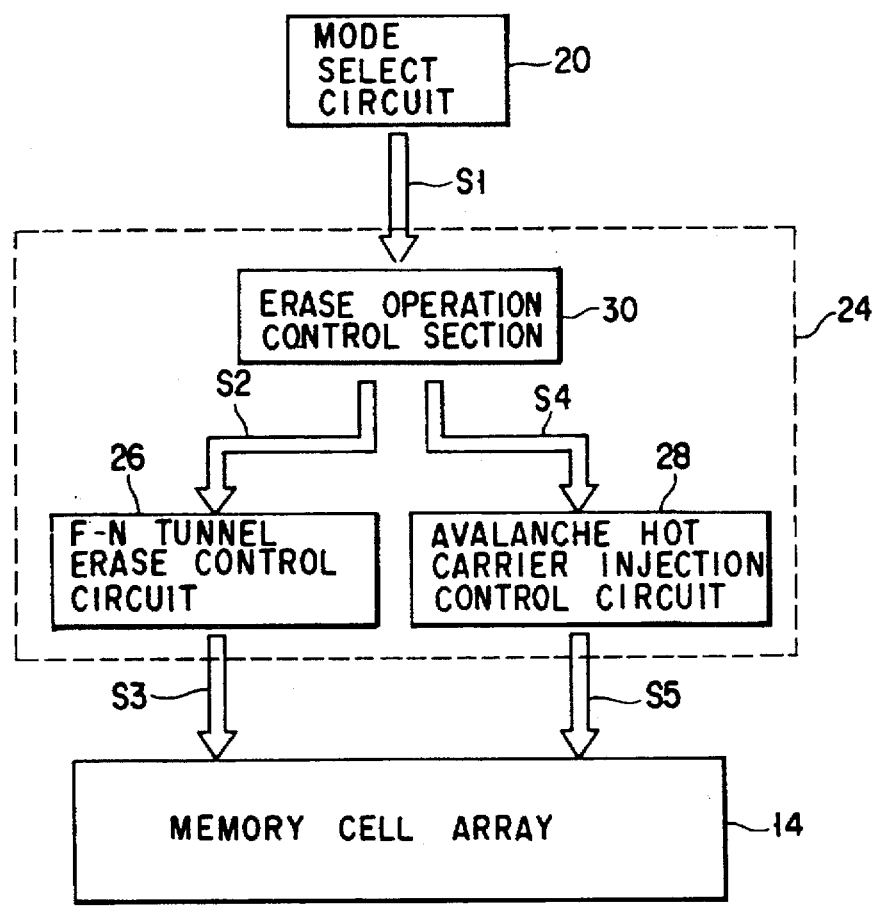
F I G. 6

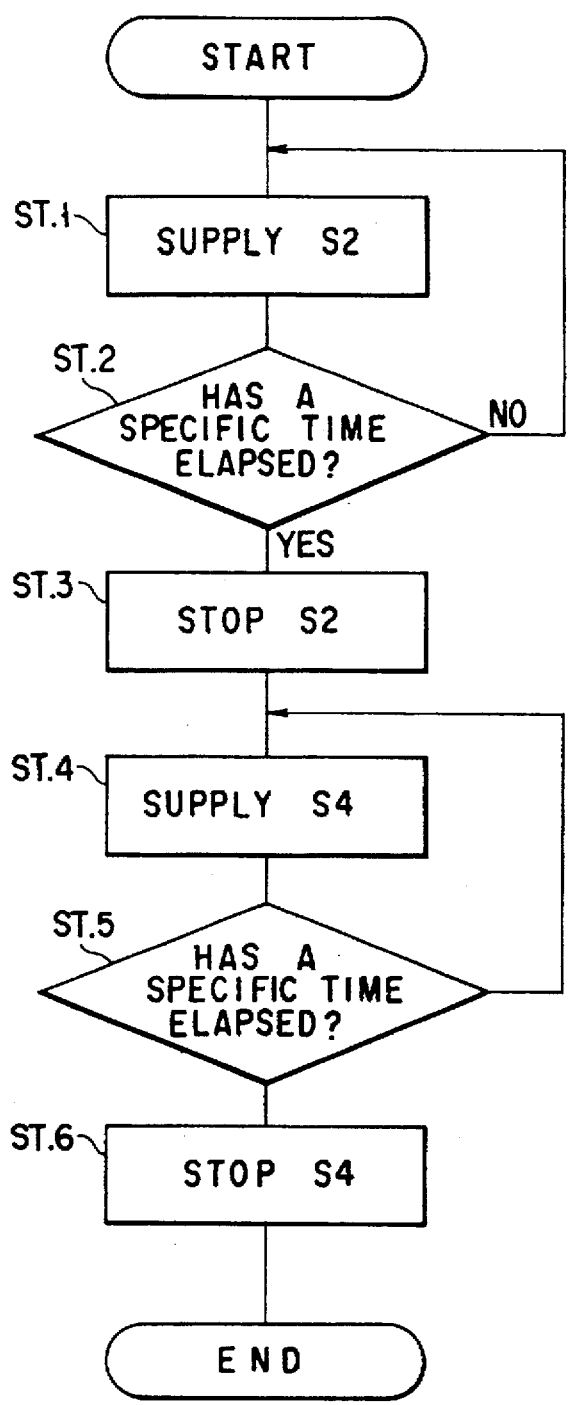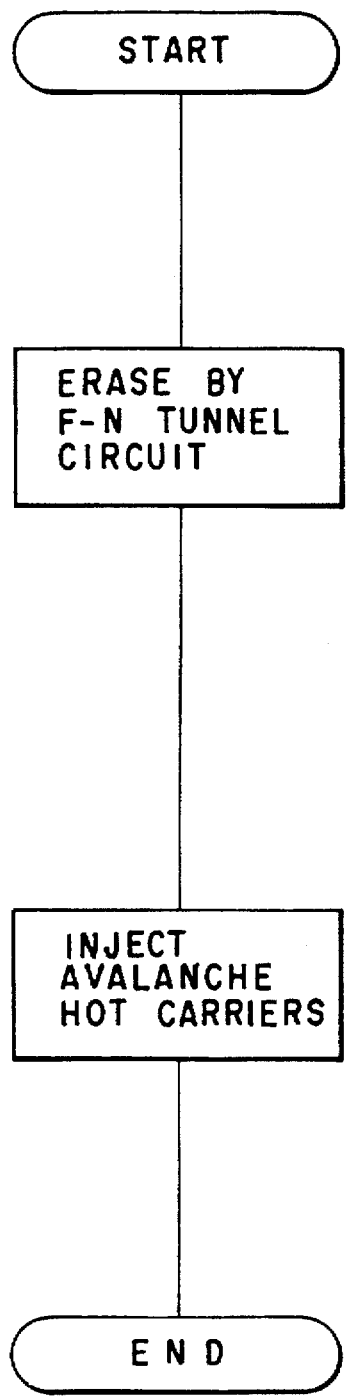
F I G. 7
F I G. 8

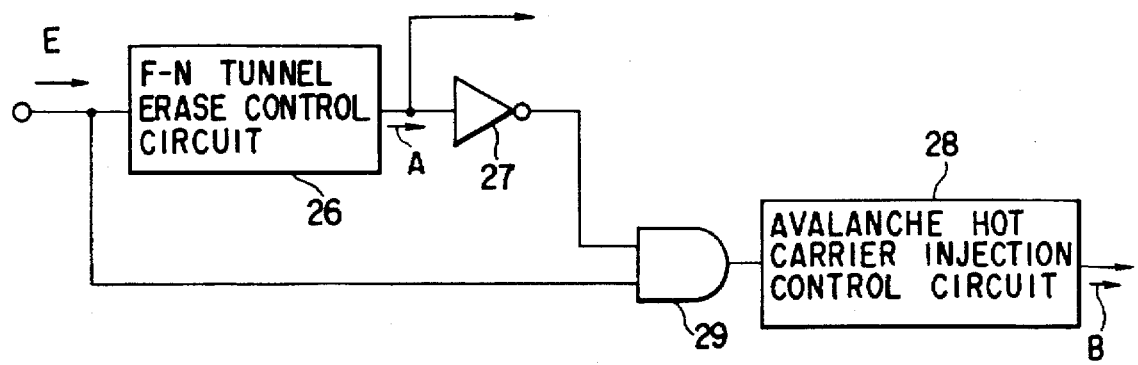
F I G. 9
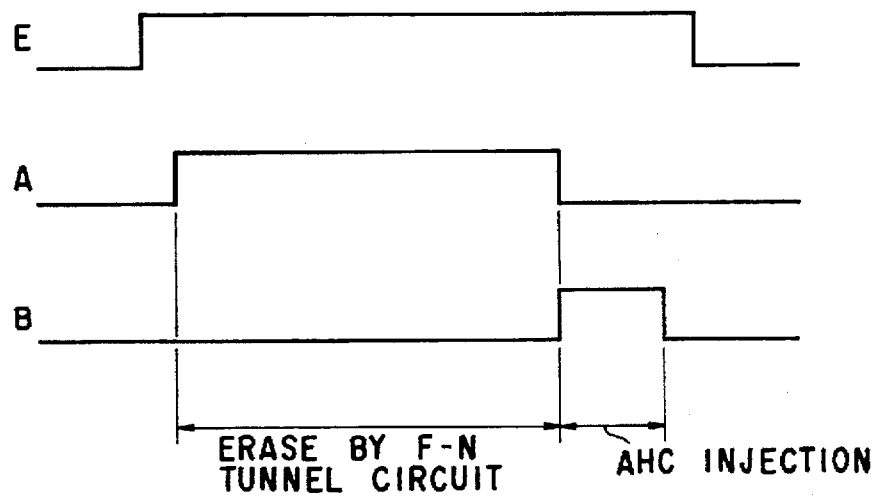
F I G. 10

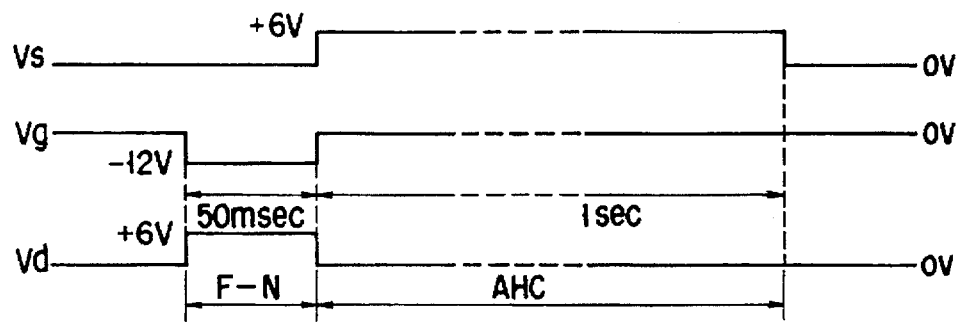
FIG. 11E
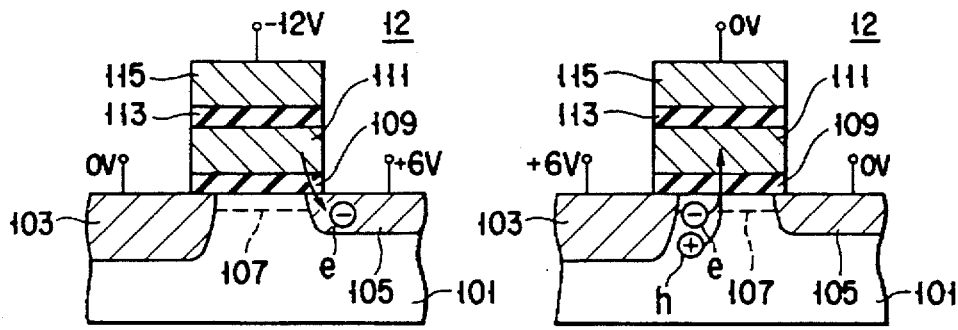
FIG. 12E
FIG. 13E
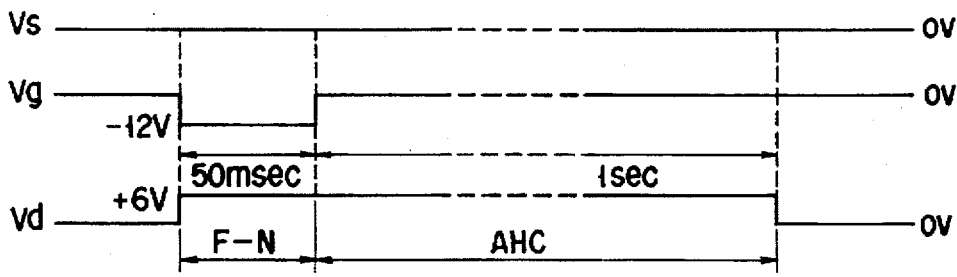
FIG. 11F
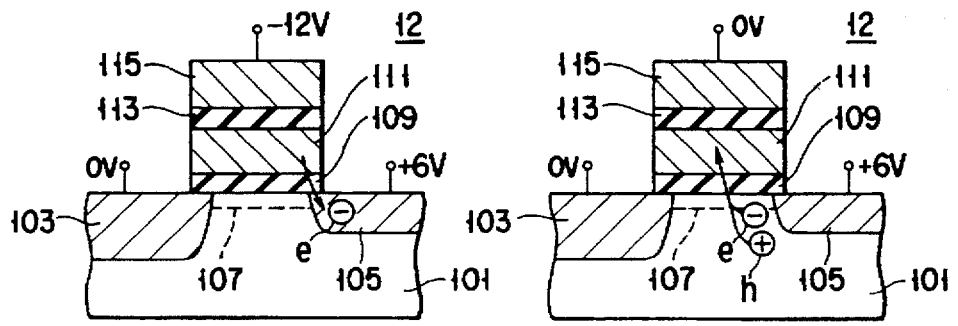
FIG. 12F
FIG. 13F

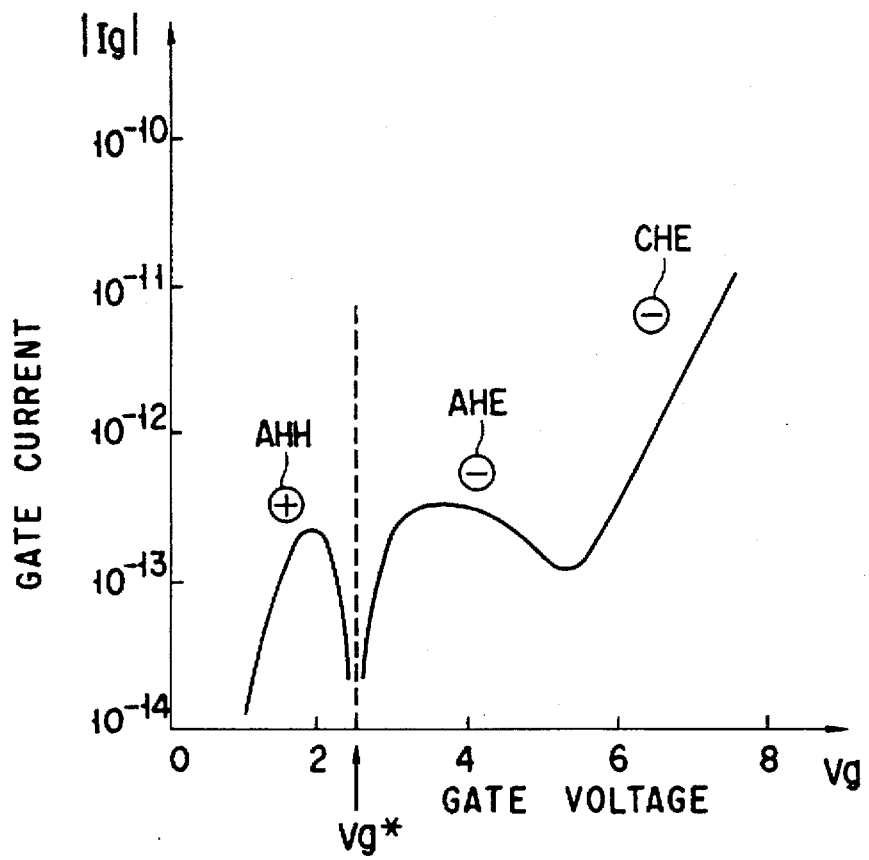
F I G. 14
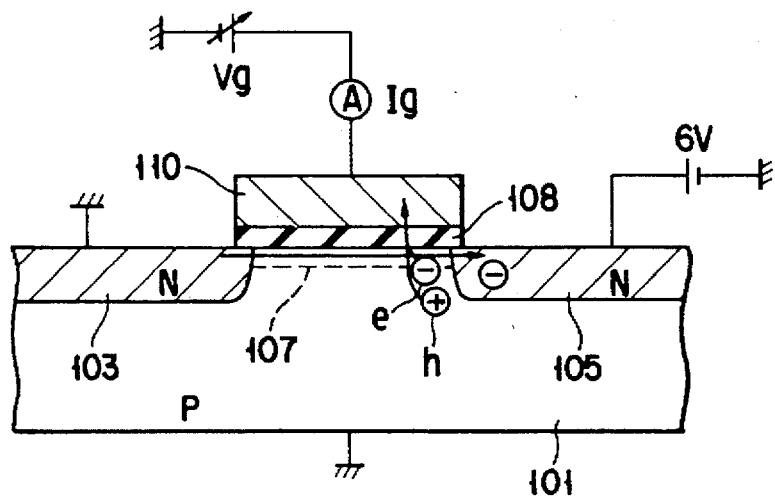
F I G. 15

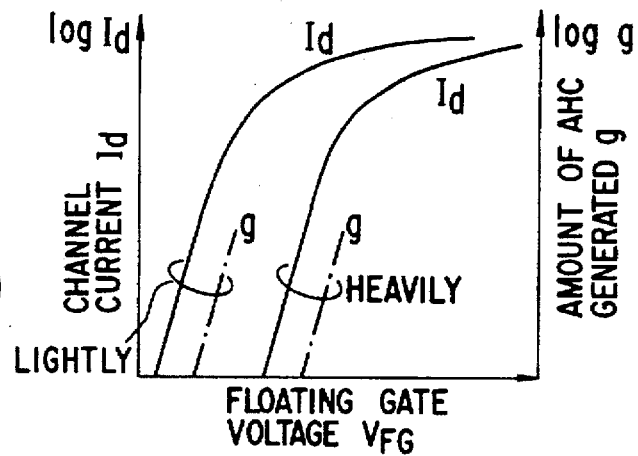
F I G. 20
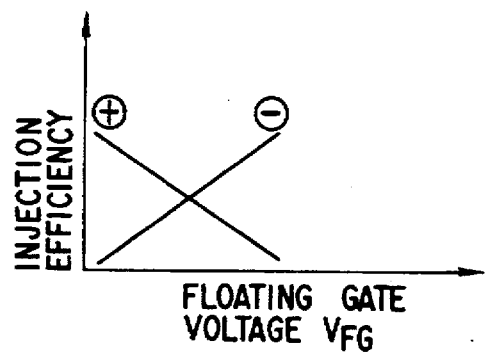
F I G. 21
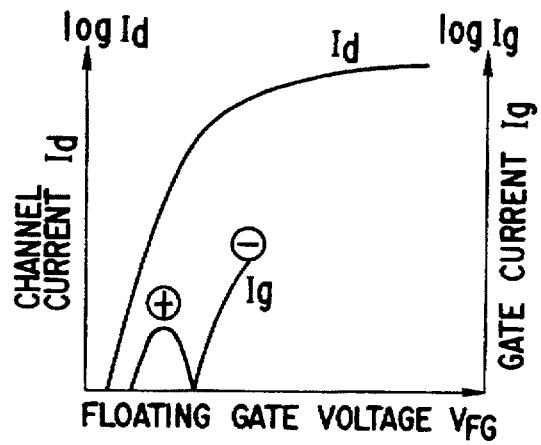
F I G. 22A
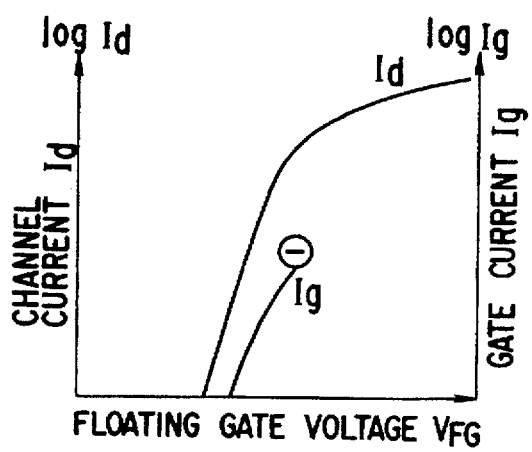
F I G. 22B

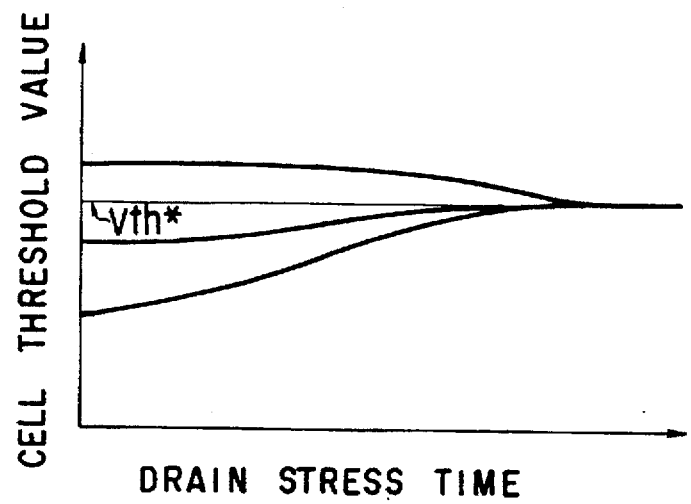
F I G. 23
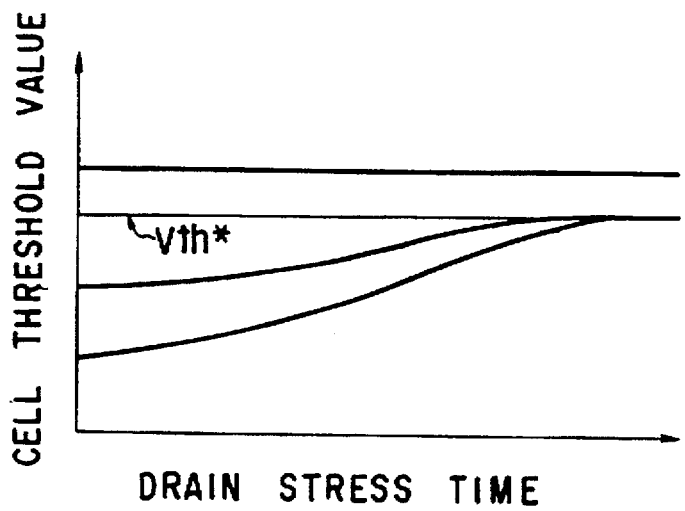
F I G. 24

SEMICONDUCTOR MEMORY DEVICE HAVING DATA ERASING MECHANISM

This application is a continuation of application Ser. No. 08/440,253, filed May 12, 1995, U.S. Pat. No. 5,623,445 which is a continuation of application Ser. No. 07/903,949, filed Jun. 26, 1992, now U.S. Pat. No. 5,452,248.

BACKGROUND OF THE INVENTION

1. Field of the Invention

This invention relates to a nonvolatile semiconductor memory device and its operating method, and more particularly to an improvement in the operation of extracting charges from the charge storage portion and to a device that performs this improved operation.

2. Description of the Related Art

FIG. 1 is a sectional view of an ordinary flash EEPROM.

As shown in FIG. 1, an n-type source diffused layer 2 and an n-type drain diffused layer 3 are formed in a p-type silicon substrate 1. On the channel region 4 is formed a first gate insulating film 5. The first gate insulating film 5 has a thickness of, for example, approximately 100 Å. Formed on the first gate insulating film 5 is a floating gate 6, on which a second gate insulating film 7 is formed. On the second gate insulating film 7 is formed a control gate 8.

The operation of the conventional cell of FIG. 1 will be explained.

How to write the data

To write the data, hot electrons are generated near the drain diffused layer 3 by applying a program voltage of, for example, 10 V, to the control gate 8, and a power supply voltage of, for example, 5 V, to the drain diffused layer 3. These hot electrons are injected from the vicinity of the drain diffused layer 3 into the floating gate 6.

How to erase the data

The flow of erasing the data is shown in FIG. 2, and the threshold value for each process is shown in FIG. 3.

First, at step 1, the data is written into all cells. This is done to prevent overerasure of the data by injecting electrons into the floating gates 6 of all cells and then extracting electrons. This action is called preprogramming.

Next, at step 2, with the drain diffused layer 5 open, the control gate 8 is applied with, for example, −10 V, and the source diffused layer 2 is applied with, for example, 5 V, to extract electrons from the floating gate 6 into the source diffused layer 2 by F-N tunnel current.

The erasure at step 2 and the verification at step 3 are repeated at intervals of 10 ms. This is done to prevent overerasure of the data by extracting electrons gradually while verifying whether the data has been overerased. This action is called intelligent erasure. Normally, repetition of erasure and verification is completed in less than one second in total.

How to read the data

The reading of the data is done as follows: with the control gate 8 applied with, for example, 5 V, and the drain diffused layer 3 applied with a reading voltage of, for example, 1 V, a 1 or a 0 is read out, depending on whether current flows through the channel 4.

Overerasure of the data in the flash EEPROM will lead to erroneous reading. For example, after the data has been overerased from an unselected cell, the cell is placed in the ON state, allowing current to flow through the bit line. This makes it impossible to correctly read the information from the selected cell. To avoid this problem, the flash EEPROM employs intelligent erasing techniques.

Although intelligent erasing techniques prevent overerasure of the data, it cannot eliminate variation in the cell threshold value after erasure. As a result, there is variation in the cell threshold value after erasure as shown in FIG. 3.

Such variation stems from the following two factors:

The first factor is variation in the electron-extracting characteristics caused by variation in the film quality of the gate insulating film. The most effective way to suppress this variation is to eliminate variation in the film quality of the gate insulating film by improving the manufacturing processes. At present, there is no process of eliminating variation in the gate insulating film quality.

The second factor is variation in the electron-extracting characteristics caused by variation in the cell work shape. This type of variation may be eliminated by obviating variation in the work shape through improved processing. Like the first factor, such effective processing has yet to be developed.

Presently, variation in the cell threshold value after erasure is approximately 2 V at maximum. As more and more cells will be squeezed into a limited space in the future, the deviation of the work shape from the design dimensions would increase. Consequently, variation in the threshold value after erasure would be larger.

As noted above, conventional flash EEPROMs have the problem that variation in the cell threshold value after extraction of electrons becomes larger as a result of variation caused by variation in the gate insulating film quality combining with variation caused by variation in the cell work shape.

SUMMARY OF THE INVENTION

A first object of the present invention is to provide a nonvolatile semiconductor memory device and its operating method which have small variation in the cell threshold value after extraction of charges, solving the problem of variation in the cell threshold value after extraction of charges becoming larger.

A second object of the present invention is to provide a new method and device for erasing the data which are capable of overcoming data overerasure problems without preprogramming.

To achieve the first object, a method of the present invention carries out the process of extracting charges from the charge storage portion before the process of injecting avalanche hot carriers into the storage portion.

With this method, although the process of extracting charges from the storage portion leaves variation in the charge-extracted state, this variation can be alleviated by injecting avalanche hot carriers into the storage portion after the charge-extracting process. There are two types of avalanche hot carriers: avalanche hot electrons (hereinafter, referred to as AHEs) and avalanche hot holes (hereinafter, referred to as AHHs). Depending on the charged state of the storage portion, either AHEs or AHHs are predominantly injected into the storage portion. The charged state of storage portion has a balanced voltage at which the AHE injection balances with the AHH injection. The potential of the storage portion is determined by the variation at the time when charges have been extracted from the storage portion. When the potential of the storage portion is higher than the balanced potential, AHEs will be injected, lowering the potential gradually to the balanced potential. Contrarily, when the charge storage portion's potential is lower than the balanced potential, AHHs will be injected, raising the potential gradually to the balanced potential. In this way, the potential of the storage portion converges at a specific value. Accordingly, the cell threshold value after extraction of charges converges at a specific value, resulting in less variation in the threshold value.

To accomplish the second object, a data erasing method of this invention includes the process of extracting charges from the charge storage portion and the process of injecting avalanche hot carriers into the charge storage portion.

With this erasing method, overerasure of the data is alleviated by using the process of injecting avalanche hot carriers instead of preprogramming. Specifically, when the storage portion is charged positive in an almost overerased state, AHEs will be injected into the storage portion to lower its potential to the balanced state. The process of injecting avalanche hot carriers into the storage portion may be carried out before or after the process of extracting charges from the storage portion. It is because overerasure of the data takes place when electrons are further extracted from the storage portion from which the data has been erased, charging the portion more positive. Lowering the potential of the storage portion at least once eliminates a possibility that the storage portion is heavily charged positive.

When a data erasing method specified above, a high potential read not be applied to the control gate as in pre-programming wherein data is written in to the cells. Hence, the device needs to consume but less power, and a data erasing time is shorten.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a memory cell;

FIG. 4 is a block diagram showing a flush EEPROM according to an embodiment of the present invention;

FIG. 5 is a sectional view of a memory cell;

FIG. 6 is a block diagram of the data erase circuit;

FIG. 7 is a flowchart for the operation of the erasing action control section;

FIG. 8 is a flowchart for erasing data;

FIG. 9 is a block diagram showing another construction of the erase circuit;

FIG. 10 is a timing chart for the circuit of FIG. 9;

FIGS. 11A to 11F are timing charts for erase operation;

FIGS. 12A to 12F are views illustrating how electrons are extracted by F-N tunneling;

FIGS. 13A to 13F are views depicting how AHEs or AHHs are injected into the floating gate;

FIG. 14 shows the relationship between the gate current and the gate voltage;

FIG. 15 is a sectional view of a MOSFET;

FIG. 20 shows the relationship between the floating gate voltage, channel current and AHC generated;

FIG. 21 shows the relationship between the floating gate voltage and the injection efficiency;

FIGS. 22A and 22B show the relationship between the floating gate voltage, the channel current and gate current;

FIGS. 23 and 24 show the relationship between the drain stress time and the cell threshold value;

DETAILED DESCRIPTION OF THE PREFERRED EMBODIMENTS

Figure 2:
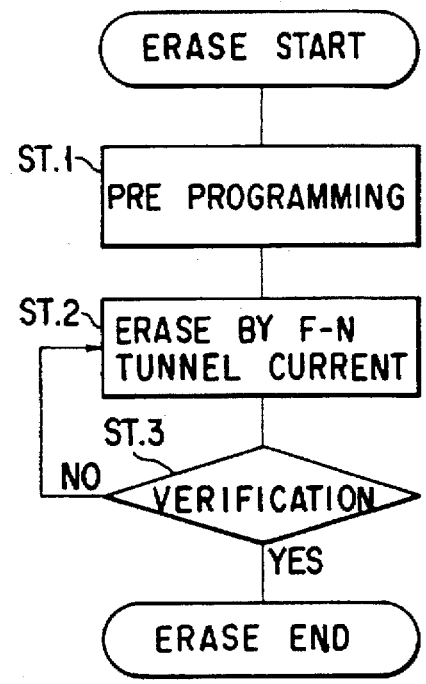
FIG. 2 is a flowchart for a conventional data erasing method.
Figure 3:
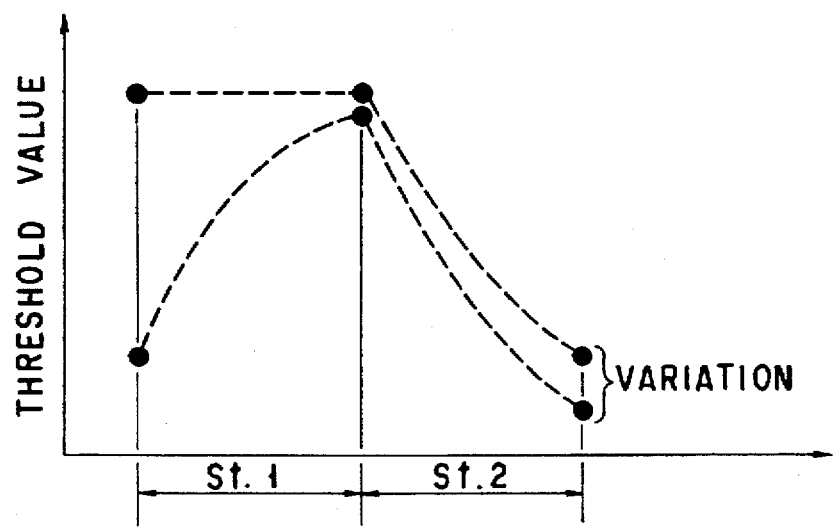
FIG. 3 shows the relationship between the cell threshold value and the erasing actions shown in FIG. 2.

Referring to the accompanying drawings, embodiments of the present invention will be explained. Like parts are shown by corresponding reference characters through-out all views of the drawings, and their repetitive explanation will be omitted.

FIG. 4 is a block diagram showing the overall construction of a flash EEPROM according an embodiment of the present invention.

As shown in FIG. 4, a plurality of memory cells 12 ($12_1$ to $12_n$) are arranged in matrix form on a chip 10.

Each memory cell 12 is constructed as shown in FIG. 5. Specifically, an n-type source diffused layer 103 and an n-type drain diffused layer 105 are formed in a p-type silicon substrate 101. On the channel region 107 is formed a first gate insulating film 109, which has a film thickness of, for example, nearly 100 Å. On the first gate insulating film 109 is formed a floating gate 111, on which a second gate insulating film 113 is formed. A control gate 115 is formed on the second gate insulating film 113.

The area where memory cells $12_1$ to $12_n$ are arranged in matrix form is called a memory cell array 14. Provided around the memory cell array 14 are a column decoder 16 for selecting the bit lines BL in the memory cell array 14, a row decoder 18 for selecting the word lines WL, and a mode select circuit 20 for selecting one of the write, erase, and read modes. The mode select circuit 20, which is connected to a data write/read circuit 22 and a data era se circuit 24, supplies a signal activating the write/read circuit in the data write/read operation and a signal activating the data erase circuit in the erase operation. The data erase circuit 24 is composed of a Fowler-Nordheim (hereinafter, abbreviated as F-N) tunnel erase control circuit 26 and an AHC injection control circuit 28. How the data in the flash EEPROM is erased will be explained below.

FIG. 6 is a block diagram of the data erase circuit 24. FIG. 7 is an operation flowchart of the erase operation control section. FIG. 8 is a data erasure flowchart.

As shown in FIG. 6, the data erase circuit 24 is provided with an erase operation control section 30. The erase execute instruction signal S1 produced at the mode select circuit 20 is supplied to the data erase circuit 24. Receiving the signal S1, the erase operation control section 30 gets activated and performs the operations shown in FIG. 7, thereby effecting the erase operation shown in FIG. 8.

Specifically, at step (hereinafter, abbreviated as ST.) 1, the signal S2 is supplied to the F-N tunnel erase control circuit 26, which is activated by the signal S2. The F-N tunnel erase control circuit 26 supplies an erase signal S3 to the memory cell array 14. The erase signal S3 is used to set the respective potentials of the gate, source, and drain of a cell 12 in the memory cell array 14 so that the data may be erased by F-N tunnel current. With this signal, electrons are extracted from the floating gate 111 by F-N tunnel current.

Then, at ST. 2, the F-N tunnel erase time is measured. After a specified set time has elapsed, at ST. 3, the supply of signal S2 is ceased.

Next, at ST. 4, a signal S4 is supplied to the AHC injection control circuit 28, which is activated by the signal S4. The AHC injection control circuit 28 supplies an inject signal S5 to the memory cell array 14. The inject signal 5S is used to set the respective potentials of the gate, source, and drain of a cell formed in the memory cell array 14 so that AHCs may be injected into the floating gate 111. With this signal, the floating gate 111 is injected with AHEs or AHHs, thereby tuning the threshold value of the cell 12. This tuning allows variations in the cell threshold value, which have occurred after extraction of electrons by F-N tunnel current, to converge at a particular threshold value determined by the cell work shape, manufacturing conditions and others (hereinafter, this particular threshold value will be referred to as the balanced threshold voltage Vth*). Thus, after electron extraction, variation in the cell threshold value becomes smaller.

Then, at ST. 5, the AHC injection set time is measured. After a particular set time has elapsed, at ST. 6, the supply of signal S5 is ceased.

After execution of the steps described above, the flush EEPROM of this invention has completed the erase operation.

FIG. 9 is a block diagram of the erase circuit and related circuitry. FIG. 10 is a timing chart for the FIG. 9 circuit.

As shown in FIG. 9, an erase signal E is supplied to the F-N tunnel erase circuit 26 and a first input of an AND gate 29. The F-N tunnel erase circuit 26, which is activated by the erase signal E, produces a signal A. The signal A is used to set the respective potentials of the gate, source, and drain of the memory cell 12 so that the data may be erased by F-N tunnel current. The signal A is supplied to the input of an inverter 27. During the time when signal A is at the high (H) level, data erasure by F-N tunnel current is carried out. The inverter 27 supplies a low (L) level signal to a second input of the AND gate 29. The F-N tunnel erase circuit 26 measures a particular erase time, and brings the signal A to a low level after the particular erase time has elapsed. When the signal A is brought to a low level, the data erasure by F-N tunnel current has completed. When the inverter 27 supplies a high level signal to the second input of the AND gate 29, both inputs of the AND gate 29 are supplied with high level signals, which causes the AND gate 29 to supply a high level signal to the AHC injection control circuit 28. The AHC injection control circuit 28, which is activated by the high level signal, supplies a signal B. During the time when signal B is at a high level, the threshold value is tuned by AHC injection. The AHC injection control circuit 28 measures a particular tuning time, and brings the signal B to a low level after the particular tuning time has elapsed. The device recognizes the completion of data erasure from the falling of the signal B, and brings the erase signal E to a low level.

A concrete example of erasing the data will be explained.

FIG. 11 is a timing chart for a first erase operation. FIG. 12A is a view showing how electrons are extracted by F-N tunneling. FIG. 13A is a view showing how AHEs or AHHs are injected in AHC injection.

Figure 11A:
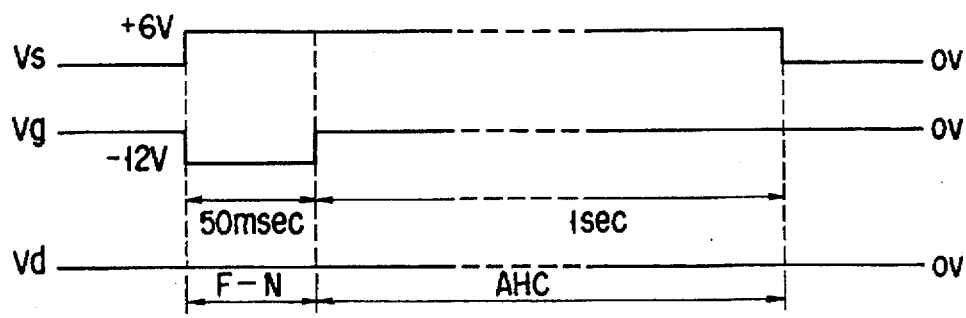
Figures 12A, 13A:
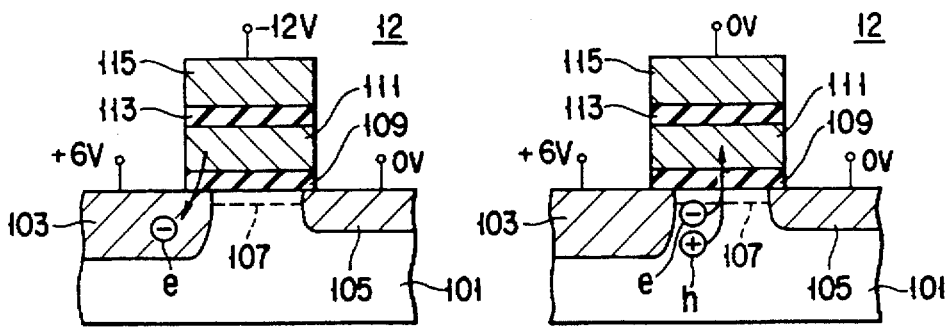

As shown in FIGS. 11A and 12A, the control gate 115 is applied with −12 V (Vg), the source diffused layer 103 is applied with +6 V (Vs), and the drain diffused layer 105 is applied with 0 V (Vd) or left open, for a certain period of time, for example, 50 milliseconds. This permits the electrons e stored in the floating gate 111 to discharge into the source diffused layer 103 by F-N tunneling.

After this operation, as shown in FIGS. 11A and 13A, the control gate 115 is applied with 0 V (Vg), the source diffused layer 103 with +6 V (Vs), and the drain diffused layer 105 with 0 V (Vd); for a certain period of time, for example, one second. This enables the AHC injection from the source diffused layer 103 into the floating gate 111, allowing electrons e (AHEs) or holes h (AHHs) to be injected into the floating gate 111. As a result, the cell threshold value distribution immediately after extraction of electrons by F-N tunneling, is adjusted so that the variations in the threshold value converge at the balanced threshold voltage Vth*, thereby reducing the variations in the threshold value.

The reading of the data is done as follows: with the control gate 115 applied with a reading voltage of, for example, 5 V, and the drain diffused layer 105 applied with a reading voltage of, for example, 1 V, a "1" or "0" is read out, depending on whether current flows through the channel region 107.

Figure 11B:
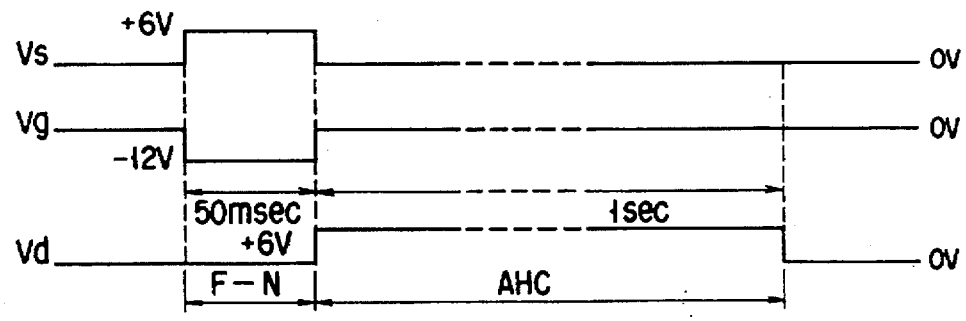
Figures 12B, 13B:
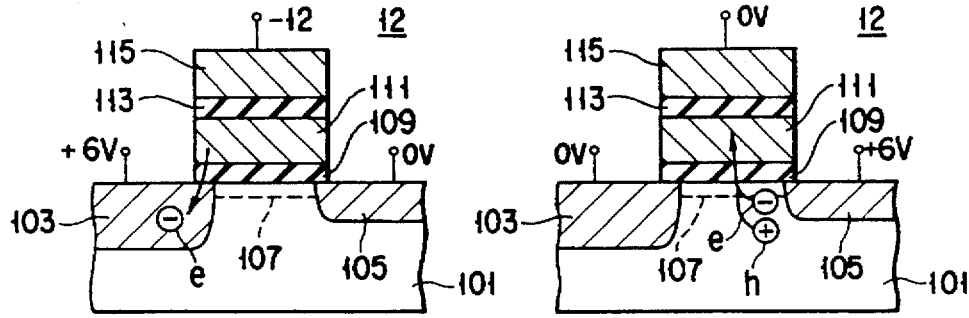

FIG. 11B is a timing chart for a second erase operation. FIG. 12B is a view showing how electrons are extracted by F-N tunneling. FIG. 13B is a view showing how AHEs or AHHs are injected in AHC injection.

First, as shown in FIGS. 11B and 12B, the control gate 115 is applied with −12 V, the source diffused layer 103 is applied with +6 V, and the drain diffused layer 105 is applied with 0 V or left open, for a certain period of time, for example, 50 milliseconds. This permits the electrons e stored in the floating gate 111 to discharge into the source diffused layer 103 by F-N tunneling.

After this operation, as shown in FIGS. 11B and 13B, the control gate 115 is applied with 0 V, the source diffused layer 103 with 0 V, and the drain diffused layer 105 with +6 V, for a certain period of time, for example, one second. This enables the AHC injection from the drain diffused layer 105 into the floating gate 111, allowing electrons e (AHEs) or holes h (AHHs) to be injected into the floating gate 111. Thus, injecting AHEs (e) or AHHs (h) from the drain diffused layer 105 also causes the redistribution of the cell threshold values as with the first operation example, thereby reducing the variations.

Figure 11C:
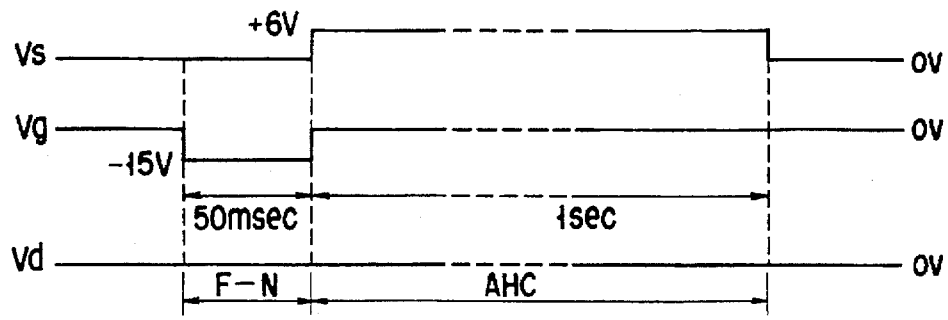
Figure 12C:
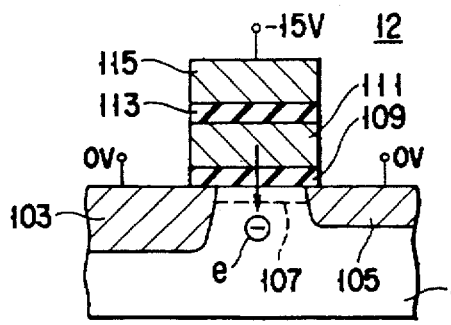
Figure 13C:
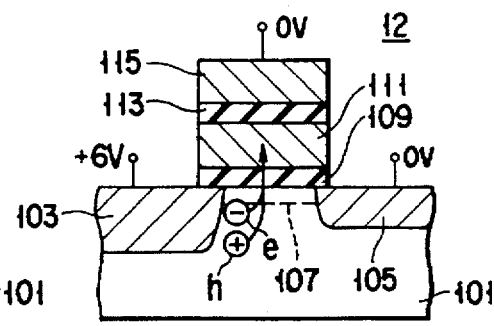

FIG. 11C is a timing chart for a third erase operation. FIG. 12C is a view showing how electrons are extracted by F-N tunneling. FIG. 13C is a view showing how AHEs or AHHs are injected in AHC injection.

First, as shown in FIGS. 11C and 12C, the control gate 115 is applied with −15 V, the source diffused layer 103 with 0 V, and the drain diffused layer 105 with 0 V, for a certain period of time, for example, 50 milliseconds. This permits the electrons stored in the floating gate 111 to discharge into the substrate 101 by F-N tunneling. This discharging brings the cell threshold value to, for example, nearly 0 V.

After this operation, as shown in FIGS. 11C and 13C, the tuning of the cell threshold value by AHC injection is done by applying 0 V to the control gate 115, +6 V to the source diffused layer 103, and 0 V to the drain diffused layer 105, for a certain period of time, for example, one second. This allows AHEs (e) or AHHs (h) to be injected into the floating gate 111. Therefore, after the erasure, the redistribution of the cell threshold values takes place so that the variations in the threshold value may converge at the balanced threshold voltage Vth*, thereby reducing the variations in the threshold value.

Figure 11D:
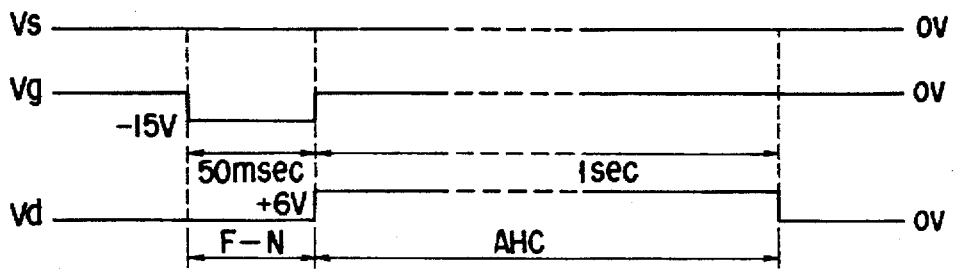
Figure 12D:
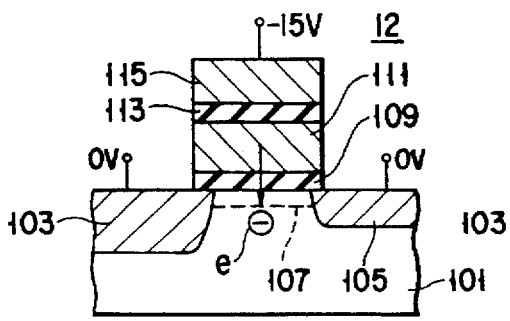
Figure 13D:
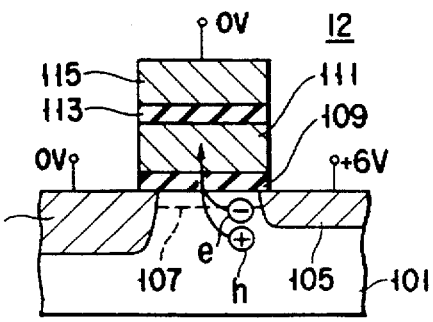

FIG. 11D is a timing chart for a fourth erase operation. FIG. 12D is a view showing how electrons are extracted by F-N tunneling. FIG. 13D is a view showing how AHEs or AHHs are injected in AHC injection. The tuning of the cell threshold value in the third operation example may be done by injecting AHEs (e) or AHHs (h) from the drain diffused layer 105 into the floating gate 111 in AHC injection.

Specifically, as shown in FIGS. 11D and 12D, the electrons stored in the floating gate 111 are allowed to escape into the substrate 101 by applying −15 V to the control gate 115, 0 V to the source diffused layer 103, and 0 V to the drain diffused layer 105, for a certain period of time, for example, 50 milliseconds.

After this operation, as shown in FIGS. 11D and 13D, AHEs (e) or AHHs (h) are injected from the drain diffused layer 105 into the floating gate 111 by applying 0 V to the control gate 115, 0 V to the source diffused layer 103, and +6 V to the drain diffused layer 105, for a certain period of time, for example, one second.

FIG. 11E is a timing chart for a fifth erase operation. FIG. 12E is a view showing how electrons are extracted by F-N tunneling. FIG. 13E is a view showing how AHEs or AHHs are injected in AHC injection.

First, as shown in FIGS. 11E and 12E, the control gate 115 is applied with −12 V, the source diffused layer 103 with 0 V, and the drain diffused layer 105 with +6 V, for a certain period of time, for example, 50 milliseconds. This permits the electrons stored in the floating gate 111 to discharge into the drain diffused layer 105 by F-N tunneling.

After this operation, as shown in FIGS. 11E and 13E, the tuning of the cell threshold value by AHC injection is done by applying 0 V to the control gate 115, +6 V to the source diffused layer 103, and 0 V to the drain diffused layer 105 (or leaving the layer 105 open), for a certain period of time, for example, one second. As with the first to fourth operation examples, this approach allows the cell threshold values to be redistributed so that they may converge at the balanced threshold voltage Vth*, thereby reducing the variations in the threshold value.

FIG. 11F is a timing chart for a sixth erase operation. FIG. 12F is a view showing how electrons are extracted by F-N tunneling. FIG. 13F is a view showing how AHEs or AHHs are injected in AHC injection.

This example is such that the tuning of the cell threshold value in the fifth operation example is done by injecting AHEs (e) or AHHs (h) from the drain diffused layer 105 into the floating gate 111 in AHC injection.

Specifically, as shown in FIGS. 11F and 12F, the electrons stored in the floating gate 111 are allowed to escape into the drain diffused layer 105 by applying −12 V to the control gate 115, +6 V to the drain diffused layer 105, and 0 V to the source diffused layer 103 (or leaving the layer 103 open), for a certain period of time, for example, 50 milliseconds.

After this operation, as shown in FIGS. 11F and 13F, AHEs (e) or AHHs (h) are injected from the drain diffused layer 105 into the floating gate 111 by applying 0 V to the control gate 115, +6 V to the drain diffused layer 105, and 0 V to the source diffused layer 103, for a certain period of time, for example, one second.

Although in the above embodiments, the F-N tunnel erase control circuit 26 and AHC injection control circuit 28 are controlled by the erase operation control section 30, these circuits 26 and 28 may be controlled by, for example, the CPU.

The data erase circuit 24 is not necessarily installed on the same substrate that contains the memory cell array 14. For example, the program writer or the like may be provided with a data erasing function that extracts electrons from the charge storage portion and then injects AHEs or AHHs into the storage portion in AHC injection, as described in the above embodiments.

The flash EEPROM constructed as described above has the advantage of reducing variation in the cell threshold value after erasure.

In conventional erasing methods, erasing is done only by F-N tunneling, resulting in variation in the cell threshold value after erasure. The threshold value after erasure is particularly dependent on the film quality of the gate insulating film. If the floating gate is made of polysilicon, whether its crystal grain boundary lies in the tunnel region is a cause of variation in the threshold value after erasure.

With the present invention, however, because the tuning by AHC injection is done after F-N tunneling, the variation in the threshold value due to F-N tunneling is reduced to as small as the threshold value immediately after the write operation (immediately after electrons have been injected into the floating gate). This is because the balanced threshold voltage Vth*, like the threshold voltage Vth just after the write operation, is dependent only on variation in the capacity coupling due to work variation.

In a method of selecting the source diffused layer and control gate (word line) and then erasing the data as described in the first erase operation, grouping the cells sharing the source diffused layers into blocks every a certain number of rows enables the data to be erased in blocks. In this case, AHC injection from the source diffused layer causes stress to be applied only to the selected block, making the unselected blocks free from stress.

The physical phenomenon of a nonvolatile semiconductor memory device of the present invention will be explained.

FIG. 14 shows the relationship between the gate current and gate voltage in the MOSFET. FIG. 15 is a sectional view of the MOSFET tested, numeral 108 indicating a gate insulating film and numeral 110 a gate.

As shown in FIGS. 14 and 15, when the source diffused layer 103 of the MOSFET is grounded and the drain diffused layer 105 is applied with, for example, 6 V, channel electrons are accelerated in the vicinity of the drain diffused layer 105, generating AHCs, or AHEs (e) and AHHs (h) as a result of ionization by collision. Both AHEs and AHHs are injected into the gate with the injection efficiency depending on the gate voltage. The gate voltage has a balanced voltage Vg* at which AHE injection balances with AHH injection. When the gate voltage Vg is lower than the balanced voltage Vg*, AHHs (h) are predominantly injected into the gate 110, allowing the gate current Ig to flow. Conversely, when the gate voltage Vg is higher than the balanced voltage Vg*, AHEs (e) are predominantly injected into the gate 110, allowing the gate current Ig in a similar manner. When the gate voltage Vg is much higher than the balanced voltage Vg*, carriers are sufficiently accelerated at the channel and turned into channel hot carriers (in this example, channel hot electrons CHEs because an n-type channel MOSFET is used), which are then injected into the gate 110, allowing the gate current Ig to flow.

A similar phenomenon can be observed in the memory cell. When a cell from which electrons have been extracted by F-N tunnel current is charged at a voltage higher than the balanced voltage Vg*, AHEs (e) among generated AHCs are predominantly injected into the floating gate, as mentioned in the above MOSFET. As a result, the potential of the floating gate drops, gradually approaching the balanced voltage Vg* from the positive side. Conversely, when a cell from which electrons have been extracted by F-N tunnel current is charged at a voltage lower than the balanced voltage Vg*, AHHs (h) are predominantly injected into the floating gate. Consequently, the potential of the floating gate rises, gradually approaching the balanced voltage Vg* from the negative side. Eventually, the cell threshold value also gradually converges to a particular threshold voltage Vth*. That is, Vth* is a cell threshold value voltage at which the floating gate is brought at the balanced voltage Vg* by AHC injection. This is why Vth* is called the balanced threshold voltage.

Figure 16:
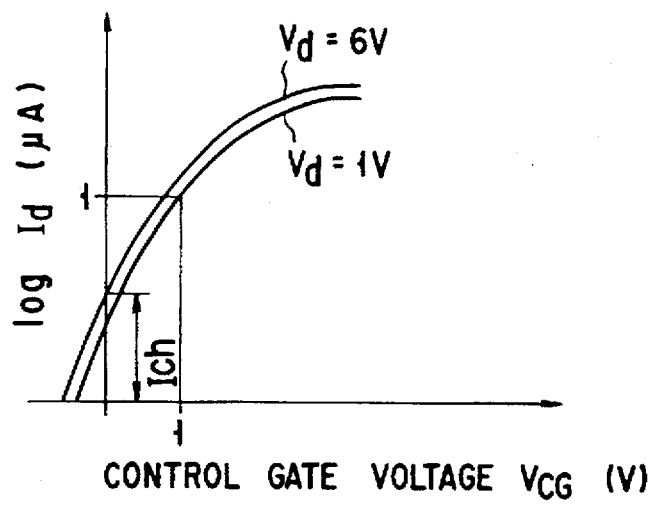
FIG. 16 shows the relationship between the drain stress time and the cell threshold value.

In the memory cell 12 shown in FIG. 5, channel electrons are allowed to run through the channel 107 to trigger AHCs. To achieve this, the cell 12 is set so that a very small amount of channel current Ich may flow even when the voltage Vg of the control gate 115 is lower than the threshold voltage, such as 0 V, as shown in FIG. 16. In FIG. 16, the cell threshold voltage is defined as the voltage of the control gate (1 V in the figure) with a drain current of 1 µA.

Figure 17:
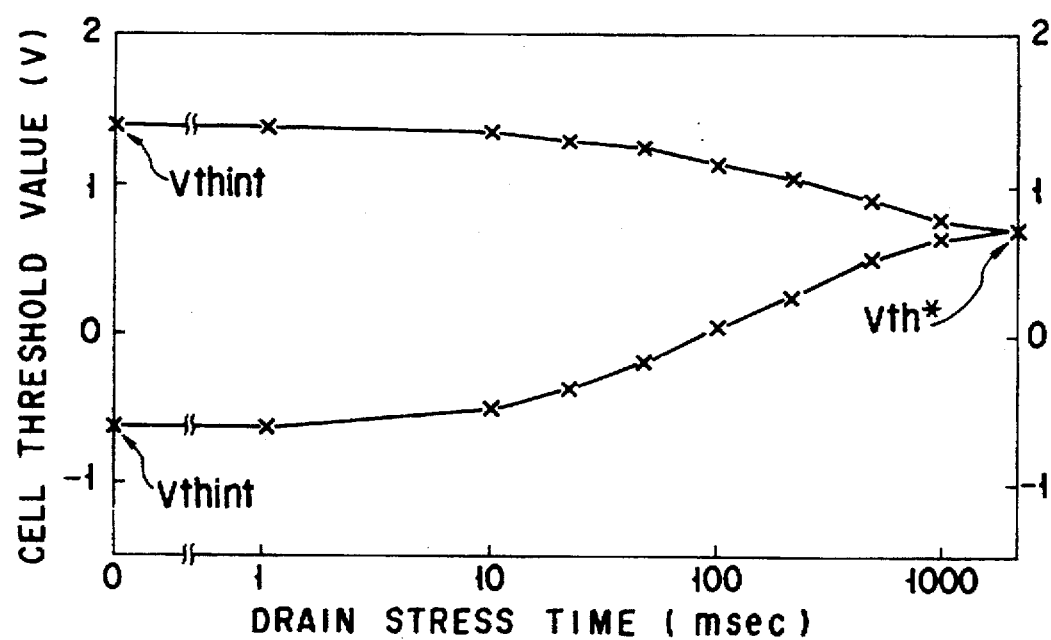
FIG. 17 shows the relationship between the drain stress time and the cell threshold value.
Figure 18:
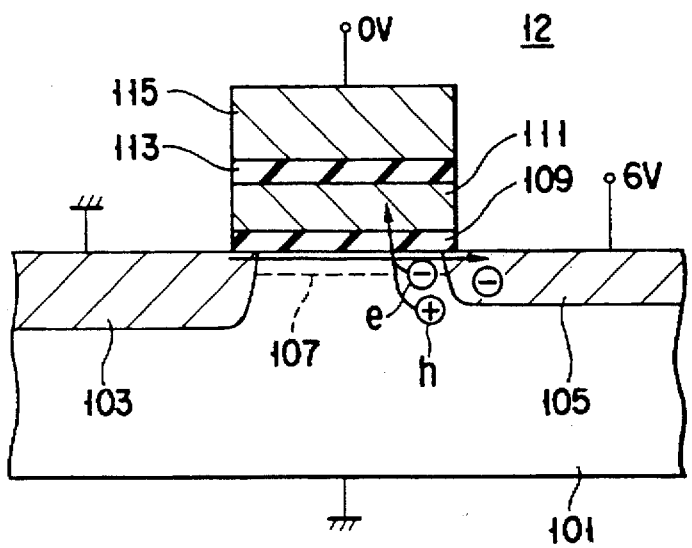
FIG. 18 is a sectional view of a memory cell.

FIG. 17 shows the relationship between the drain stress time and the cell threshold value. FIG. 18 is a sectional view of the memory cell tested.

As shown in FIGS. 17 and 18, the source diffused layer 103 of the cell 12 is grounded, the control gate is applied with 0 V, and the drain diffused layer 105 is applied with, for example, 6 V. with the drain diffused layer 105 under such stress, the threshold value of the cell 12 varies with the stress time. For example, when the drain diffused layer is put under stress with a cell's initial threshold value Vth$_{int}$ of nearly 1.5 V, the threshold value will drop to nearly 0.7 V after 1000 milliseconds have elapsed. When the drain diffused layer is placed under stress with a cell's initial threshold value Vth$_{int}$ of nearly −0.5 V, the threshold value will rise to nearly 0.7 V after 1000 milliseconds have elapsed. Thus, the cell 12 tested has the balanced threshold voltage Vth* of nearly 0.7 V.

As described above, for example, with the drain diffused layer 105 under stress, when the initial threshold voltage Vth$_{int}$ is higher than the balanced threshold voltage Vth* (0.7 V), AHHs are injected into the floating gate 111; in contrast, when the initial threshold voltage Vth$_{int}$ is lower than the balanced threshold voltage, AHEs are injected into the floating gate 111. As the stress-applying time elapses, the shift of the cell threshold value takes place, with the result that the cell threshold value converges at the balanced threshold voltage Vth*.

Figure 19:
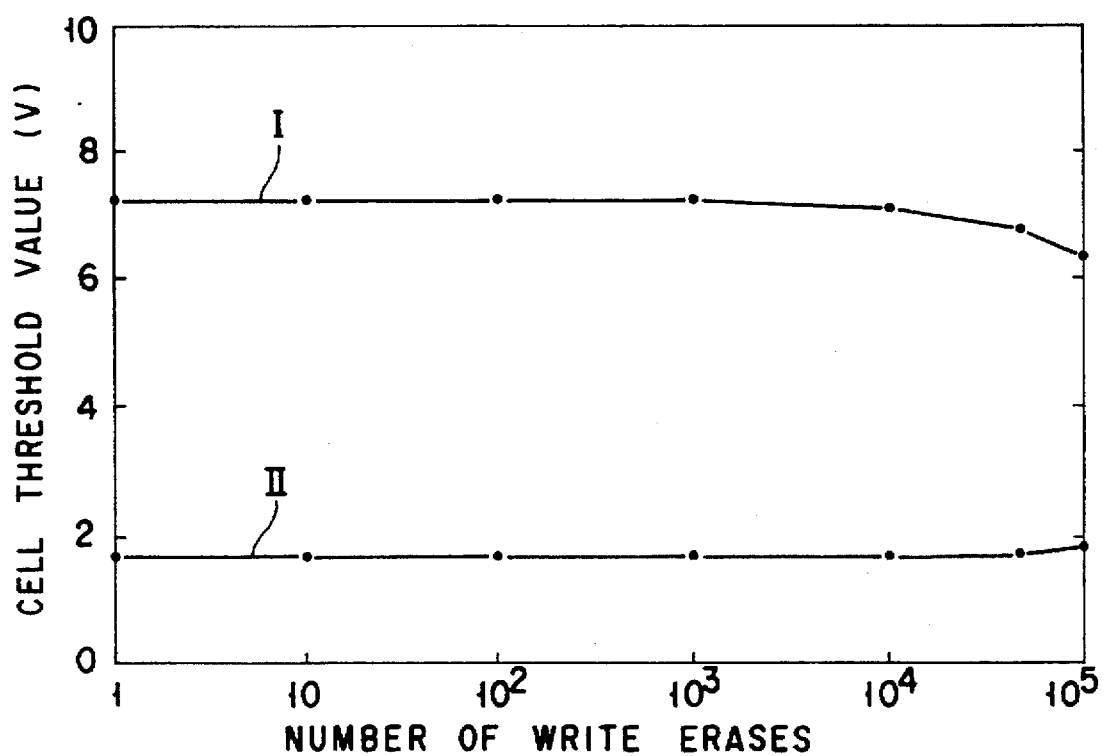
FIG. 19 shows the endurance characteristics.

FIG. 19 shows the endurance characteristics of a flash EEPROM according to the present invention, with the abscissa indicating the number of writes and erases, the ordinate the cell threshold value, line I the threshold value after the write operation, and line II the threshold value after the erase operation. In this endurance test, such a cell was used as had a design threshold value of approximately 0.7 V after F-N tunnel erasure and a balanced threshold voltage Vth* of approximately 1.7 V after tuning. The test conditions were as follows:

[Write operation]

The control gate was applied with +10.5 V, the drain diffused layer was applied with +5.0 V, and the source diffused layer was left open, for 10 microseconds.

[Erase operation]

The control gate was applied with −12 V, the drain diffused layer with 0 V, and the source diffused layer with +6 V, for 50 microseconds. Then, for the tuning operation, the control gate was applied with 0 V for 0.5 second.

Under these conditions, write and erase operations were repeated.

The results of the endurance test show that variation in the threshold value was approximately 0.2 V even after the number of writes and erases had reached $10^5$ as shown in FIG. 19. The present invention has so less adverse effect on reliability including the cell endurance that there is no problem in practical use.

The present invention is not limited to the above embodiments, but may be practiced or embodied in still other ways.

For example, in embodying this invention, the memory cell may take any form. As an example, in addition to the cell shown in the above embodiments, the present invention may be applied to a cell that has an erase gate partly overlapping the floating gate via an insulating film, and that applies a voltage to the erase gate to permit the electrons stored in the floating gate to be extracted into the erase gate by F-N tunneling through the insulating film. Specifically, after the electrons stored in the floating gate have been extracted into the erase gate, injecting AHEs or AHHs into the floating gate with the source or drain diffused layer applied with a voltage has the same effect as with the above embodiments.

In addition to the floating gate, the charge storage portion for storing data may be of what is called the MNOS (Metal Nitride Oxide Semiconductor) type. The MNOS type uses a stacked film of a silicon oxide film and a silicon nitride film as a gate insulating film, and writes the data by injecting electrons into the traps spreading over the interface between those films and over the nitride film.

The present invention may be applied to not only flash EEPROMs but also, for example, ultraviolet EPROMs. In the latter case, the electrons stored in the floating gate are excited by ultraviolet radiation instead of F-N tunneling, to allow them to go over the barrier of the insulating film, and to be extracted into the substrate, the source or drain diffused layers, or the like. After this, AHEs or AHHs are injected into the floating gate as explained in the above embodiments. In this case, since the balanced threshold voltage Vth* is theoretically lower than the threshold voltage UV-Vth created by ultraviolet radiation, it is possible to shift the cell threshold value after ultraviolet radiation of the EPROM cells to a lower threshold value. This makes more cell current flow, speeding up the operation. When the present invention is applied to EEPROM cells other than flash EEPROM cells, where the state in which electrons have been extracted from the floating gate is defined as the write state, it is possible to eliminate variations in the cell threshold value after the write operation.

The balanced threshold voltage Vth* may be controlled not only by adjusting the cell shape or the impurity concentration in the channel region, but also by applying a suitable voltage to the control gate in AHC injection. Specifically, applying a positive potential to the control gate in AHC injection causes the balanced threshold voltage Vth* to shift toward greater values, whereas applying a negative potential to the control gate causes the balanced threshold voltage Vth* toward smaller values. In this way, the balanced threshold voltage Vth* may be controlled as required.

The initial threshold voltage $Vth_{int}$ immediately after F-N tunnel erasing may be either lower or higher than the balanced threshold voltage Vth* as explained in the above embodiments. Since AHE injection efficiency is higher than AHH injection efficiency, it is desirable that the initial threshold voltage $Vth_{int}$ should be set lower than the balanced threshold voltage Vth* to allow AHE injection to take place predominantly. When AHH injection is decreased by enabling AHE injection to occur predominantly, the trapping of holes into the gate oxide film or the like is suppressed, thereby preventing the gate oxide film from deteriorating.

This method will be explained in more detail, referring to the drawings.

FIG. 20 is a graph illustrating the relationship between the floating-gate voltage VFG on the one hand, and the channel current Id and the AHC generated, on the other, for two devices having different channel-impurity concentrations.

As is evident from FIG. 20, the higher the floating-gate voltage $V_{FG}$, the greater the channel current Id. The VFG-Id curve shifts to a higher $V_{FG}$ point, for the device having the higher channel-impurity concentration. Since the AHC is induced from the current Ic, it increases as the current Ic increases. The AHC generated also shifts to a high $V_{FG}$ point, for the device having the higher channel-impurity concentration.

FIG. 21 is a graph explaining the relationship between the floating-gate voltage $V_{FG}$ and the AHC injection efficiency.

As can be understood from FIG. 21, the AHH injection efficiency (line I) is higher than the AHE injection efficiency (line II) as long as the voltage $V_{FG}$ remains relatively low. This is because the electric field extending from the drain toward the gate is intense at a low floating-gate voltage $V_{FG}$. The electric field becomes less intense as the voltage $V_{FG}$ increases. The AHH-injection efficiency (line II) becomes higher than the AHE-injection efficiency (line I) at a specific floating-gate voltage $V_{FG}$.

FIG. 21 is a graph schematically showing the relationship between the floating-gate voltage $V_{FG}$ and the AHC injection efficiency, which is observed in a device having a low channel-impurity concentration.

The $V_{FG}$-AHC relationship illustrating in FIG. 22A results from the fact that the AHC injected is proportional to the product of the AHC and the AHC-injection efficiency shown in FIGS. 22A and 22B, respectively. Since the channel-impurity concentration is low, a channel current starts flowing at a low floating-gate voltage. At a low floating-gate voltage, both the AHH and the AHH-injection efficiency increase, and the AHH can readily be injected. At a high floating-gate voltage, on the other hand, both the AHE and the AHE-injection efficiency increases, and the injection of the AHE is predominant.

FIGS. 23 and 24 are graphs illustrating the relationship between the drain-stress time and the threshold voltage of the cell. More precisely, the FIG. 23 shows the relationship the drain-stress time and the threshold voltage have if the channel-impurity concentration is low.

FIG. 22B is a graph showing the relationship which the floating-gate voltage VFG and the injected AHC have if the channel-impurity concentration is high.

In the case where the channel-impurity concentration is high, the channel current starts flowing only when the floating-gate voltage is raised. The AHC, which is induced from the channel current, is generated when the floating-gate voltage is increased. At a high floating-gate voltage, both the AHE generated and the AHE-injection efficiency increase, and the AHE can readily be injected. The AHH, on the other hand, can hardly be injected. This is because the AHH-injection efficiency is low at a high floating-gate voltage, though it is induced from the channel current. In short, if the channel-impurity concentration is high, the AHH can scarcely be injected. If the channel-impurity concentration is high, the drain-stress time and the cell threshold voltage will have the relationship which is illustrated in FIG. 24.

As a result, by raising the impurity concentration in the channel, it is possible to form cells that enable predominant AHE injection without changing the cell threshold value.

To increase the AHH injection efficiency, the source and drain diffused layers must be applied with a pulse voltage.

While in the previous embodiments, the erase operation by F-N tunneling is performed once, it may be carried out more than once by intelligent erasing techniques. Specifically, erase and verify operations are repeated by intelligent erasing techniques until all cells have turned on, and after it is judged that all cells are below the desired threshold value, the tuning of the threshold value is done by AHC injection.

The present invention can prevent the overerasure of cells without using intelligent erasing techniques, since AHEs are injected into overerased cells (cells whose floating gate is heavily charged positive after F-N tunnel erasing) to shift the charged state of the cells toward a more positive side, thereby increasing the cell threshold value.

In addition, the present invention basically requires no preprogramming, since to eliminate the overerased state, AHEs are injected into the overerased cells resulting from extracting electrons from the erased cells.

An erasing method of this type will be explained, referring to the drawings.

Figure 25:
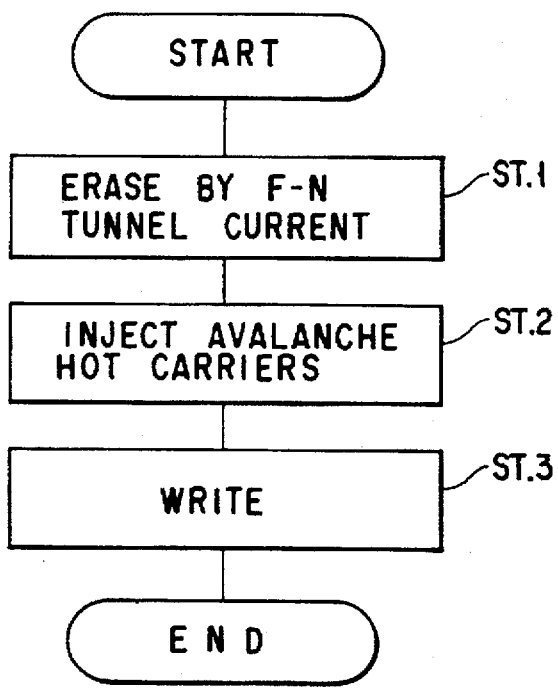
FIG. 25 is a flowchart for erasing data.
Figure 26:
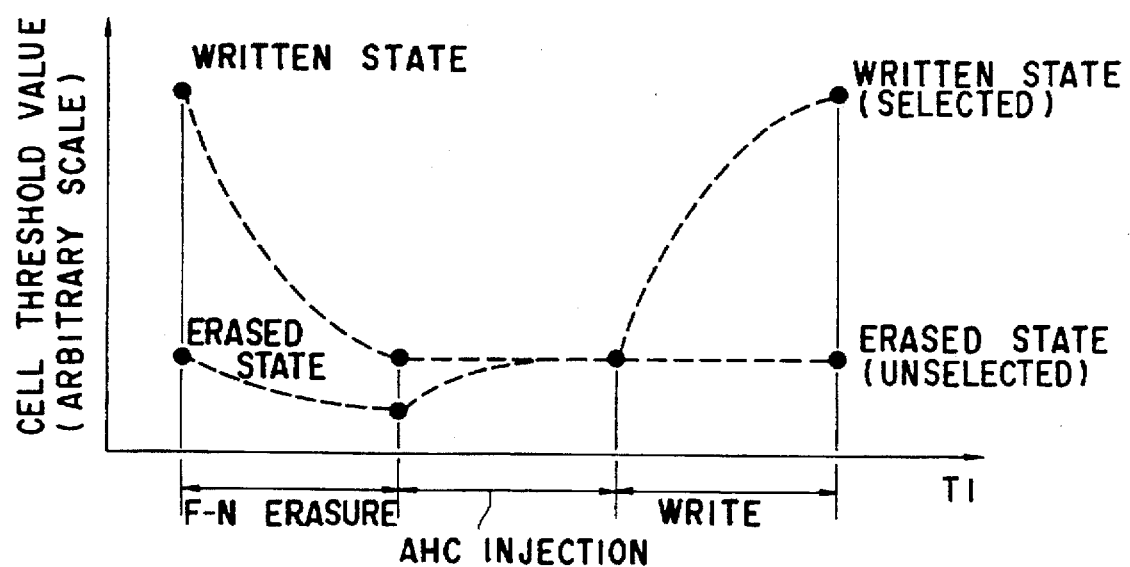
FIG. 26 show the relationship between the erasing operation of FIG. 25 and the cell threshold value.

FIG. 25 is a flowchart covering the erase and write is operations. FIG. 26 shows the relationship between the erase operation of FIG. 25 and the cell threshold value.

As shown in FIGS. 25 and 26, electrons are simultaneously extracted by F-N tunnel current from the written cells and erased cells (ST. 1). Then, AHCs are injected into the just erased cells to tune the threshold value (ST. 2). Next, the control gate of the selected cell is applied with a program voltage of, for example, 10 V, the source diffused layer is grounded, and the drain diffused layer is applied with an operating voltage of, for example, 5 V, to accelerate channel electrons to generate channel hot electrons (CHEs), which are then injected into the cell to write the data (ST. 3). The data may be written by applying 10.5 V to the control gate, and 5.0 to the drain diffused layer, and leaving the source diffused layer open to break down the junction of the drain diffused layer and substrate to generate AHEs, which are then injected into the cell. These AHEs differ in their source from the AHEs used in tuning the threshold value. That is, the AHEs used for threshold value tuning are generated by channel current, whereas those used in writing the data are produced by breakdown current. When the voltage of the control gate is lower than the threshold value, the potential of the floating gate converges at the balanced potential $V_{FG}*$. When the voltage of the control gate is higher than the threshold value, however, AHEs are accelerated more heavily, so that more AHEs are injected into the floating gate. As a result, the potential of the floating gate is shifted toward a written potential lower than the balanced potential.

With this erasing method, the cells will not be overerased, since the threshold value is increased by AHC injection even when the data is erased without using preprogramming or intelligent erasing techniques.

Figure 27:
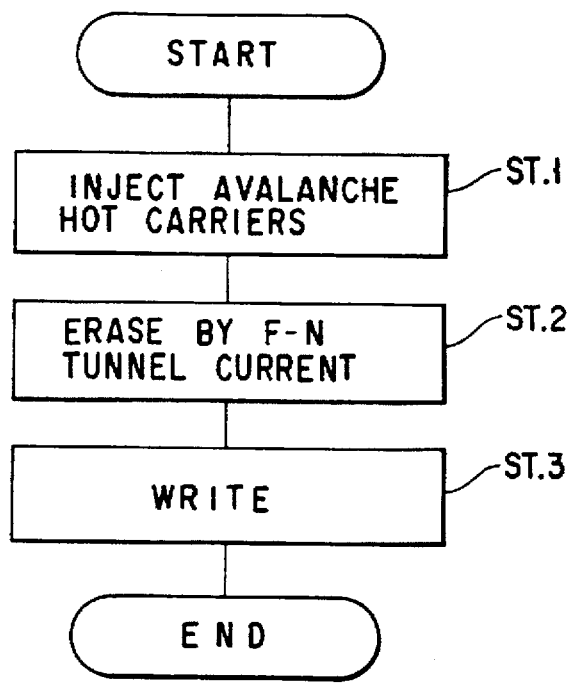
FIG. 27 is a flowchart for another data erasing method.
Figure 28:
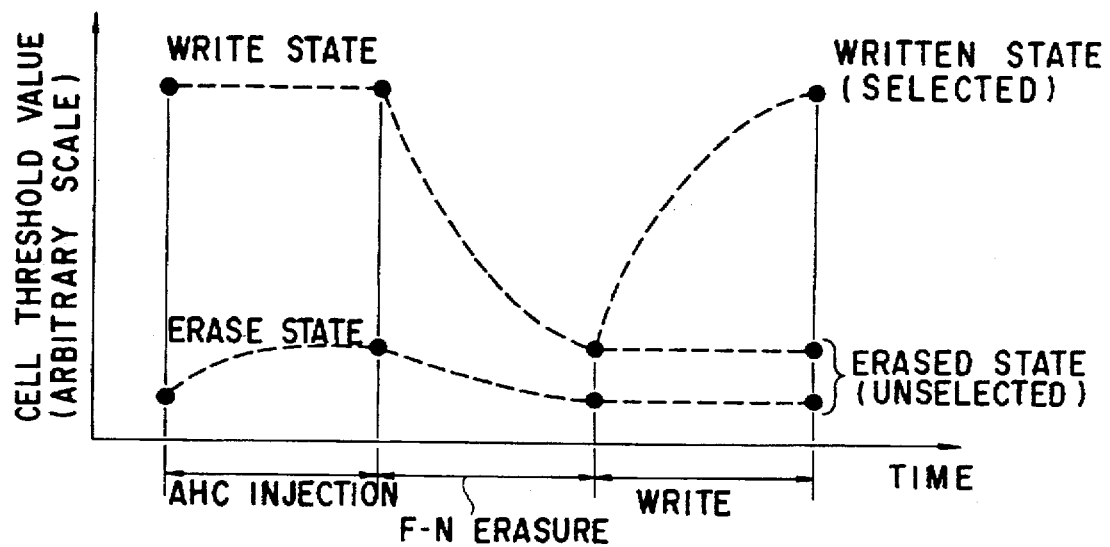
FIG. 28 shows the relationship between the cell threshold value and the erasing operation of FIG. 27.

FIG. 27 is a flowchart covering the erase and write operations in another modification. FIG. 28 shows the relationship between the erase operation and the threshold value.

As shown in FIGS. 27 and 28, AHCs are simultaneously injected into the written cells and the erased cells (ST. 1). This allows AHEs to be injected into the cells whose threshold value is low (in the erased state), to raise the threshold value to the balanced threshold value. In this case, for example, when a method of suppressing AHH injection shown in FIG. 22 is used, the cells whose threshold value is high (in the written state) remain almost unchanged in their value. After this, electrons are simultaneously extracted by F-N tunnel current from the written cells and the erased cells (ST. 2). Then, CHEs are injected into the selected cell to write the data, in a similar manner to the method described in FIG. 25 (ST. 3).

With this method, after the data is erased by F-N current, there is variation in the threshold value of the erased cells. However, the process of raising the threshold value by AHC injection as with the method shown in FIG. 25, prevents the cells from being overerased.

This erasing method enables AHC injection with the control gate at, for example, 0 V, thereby reducing the power consumption, as compared with a preprogramming method that injects CHEs into the cell with the control gate at, for example, 12 V. Additionally, one data erasure by F-N tunnel current presents an acceptable result, requiring a shorter time for data erasure than an intelligent method that repeats erasure of this type several times.

The following erasing method is still within the scope of the present invention.

In this method, after erasing is done by F-N tunneling, verification is performed. When it is determined that there is no overerased cell, AHC injection is not carried out. Only when it is judged that there are overerased cells, the corresponding bit lines are detected, and a potential is applied to those bit lines to tune the threshold value by AHC injection from the drain diffused layer.

When the device is driven in the method specified above, a high potential need not be applied to the control gate as in pre-programming wherein data is written into the cells. Hence, the device needs to consume but less power.

In pre-programming (i.e., an operation of making the threshold voltages of the cell substantially equal to one another), data is written into the cells in units of several bytes. By contrast, in the method of this invention, the threshold voltages of the cells can be equalized within a shorter time since this voltage equalization is achieved by simultaneously applying an AHC stress on all cells of a block, thereby to erase data from this block. Obviously, the time required for erasing data, including the period of equalizing the threshold voltages of the cells, can be shorter than is required in the pre-programming.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:
  a body of semiconductor material of a first conductivity type;
  memory cells formed in said semiconductor body, each memory cell comprising:
    source and drain regions of a second conductivity type formed in said semiconductor body to define a channel therebetween;
    a charge storage portion; and
    a control gate;
  a discharge circuit for discharging charges from said charge storage portions of said memory cells, said discharge circuit comprising:
    a Fowler-Nordheim (F-N) tunnel control circuit for generating a signal for setting voltages of the control gate, source region, and drain region of at least one of said memory cells such that the charge in said at least one of said memory cells is discharged by F-N tunneling; and
  an injection control circuit for setting voltages of the control gate, source region and drain region of said at least one of said memory cells such that avalanche hot electrons are injected into the charge storage portion of said at least one of said memory cells to converge a voltage of the charge storage portion of said at least one of said memory cells to a balanced voltage at which avalanche hot electron injection balances with avalanche hot hole injection, whereby a threshold voltage of said at least one of said memory cells converges to a balanced threshold voltage $Vth*$.

2. A semiconductor memory device, comprising:
  a body of semiconductor material of a first conductivity type;
  memory cells formed in said semiconductor body, each memory cell comprising:
    source and drain regions of a second conductivity type formed in said semiconductor body to define a channel therebetween;
    a charge storage portion; and
    a control gate;
  a discharge circuit for discharging charges from said charge storage portions of said memory cells, said discharge circuit comprising:
    a Fowler-Nordheim (F-N) tunnel control circuit for generating a signal for setting voltages of the control gate, source region, and drain region of at least one of said memory cells such that the charge in said at least one of said memory cells is discharged by F-N tunneling; and
  an injection control circuit for setting voltages of the control gate, source region, and drain region of said at least one of said memory cells such that avalanche hot electrons are injected into the charge storage portion of said at least one of said memory cells to converge a voltage of the charge storage portion of said at least one of said memory cells to a balanced voltage when a voltage of the charge storage portion after discharge is higher than the balanced voltage, whereby a threshold voltage of said at least one of said memory cells converges to a balanced threshold voltage $Vth*$.

3. A device according to claim 2, wherein said avalanche hot carriers are avalanche hot electrons.

4. A semiconductor memory device, comprising:

a body of semiconductor material of a first conductivity type;

memory cells formed in said semiconductor body, each memory cell comprising:
- source and drain regions of a second conductivity type formed in said semiconductor body to define a channel therebetween;
- a charge storage portion; and
- a control gate;

a discharge circuit for discharging charges from said charge storage portions of said memory cells, said discharge circuit comprising:
- a Fowler-Nordheim (F-N) tunnel control circuit for generating a signal for setting voltages of the control gate, source region, and drain region of at least one of said memory cells such that the charge in said at least one of said memory cells is discharged by F-N tunneling; and
- an injection control circuit for setting voltages of the control gate, source region and drain region of said at least one of said memory cells such that avalanche hot carriers are injected into the charge storage portion of said at least one of said memory cells to converge a voltage of the charge storage portion of said at least one of said memory cells to a balanced voltage when a voltage of the charge storage portion after discharge is lower than the balanced voltage, wherein a threshold voltage of said at least one of said memory cells converges to a balanced threshold voltage Vth*.

5. A device according to claim 4, wherein said avalanche hot carriers are avalanche hot holes.

6. A semiconductor memory device comprising:

a body of semiconductor material of a first conductivity type;

memory cells formed in said semiconductor body, each memory cell comprising:
- source and drain regions of a second conductivity type formed in said semiconductor body to define a channel therebetween;
- a charge storage portion; and
- a control gate;

a discharge circuit for discharging charges from said charge storage portions of said memory cells, said discharge circuit comprising:
- a Fowler-Nordheim (F-N) tunnel control circuit for generating a signal for setting voltages of the control gate, source region, and drain region of at least one of said memory cells such that the charge in said at least one of said memory cells is discharged by F-N tunneling such that a voltage of the charge storage portion of said at least one of said memory cells is set to a first voltage; and
- an injection control circuit for setting voltages of the control gate, source region and drain region of said at least one of said memory cells such that avalanche hot carriers are injected into the charge storage portion of said at least one of said memory cells to converge a voltage of the charge storage portion of said at least one of said memory cells to a second voltage when the first voltage of the charge storage portion after discharge differs from the second voltage, whereby a threshold voltage of said at least one of said memory cells converges to a balanced threshold voltage Vth*.

7. A semiconductor memory device, comprising:

a memory cell comprising a charge storage portion; and a first control circuit for controlling a discharge of charge stored in said charge storage portion of said memory cell such that a voltage of said charge storage portion of said memory cell is set to a first voltage; and a second control circuit for controlling an injection of avalanche hot carriers into said charge storage portion of said memory cell to converge a voltage of said charge storage portion of said memory cell to a second voltage when the first voltage of said charge storage portion of said memory cell differs the second voltage, whereby a threshold voltage of said memory cell converges to a balanced threshold voltage Vth*.

* * * * *